(12) United States Patent
Takamine

(10) Patent No.: US 8,436,697 B2
(45) Date of Patent: May 7, 2013

(54) SURFACE ACOUSTIC WAVE FILTER DEVICE

(75) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/558,402

(22) Filed: Jul. 26, 2012

(65) Prior Publication Data
US 2012/0286896 A1 Nov. 15, 2012

Related U.S. Application Data

(63) Continuation of application No. PCT/JP2010/062152, filed on Jul. 20, 2010.

(30) Foreign Application Priority Data

Jan. 28, 2010 (JP) ................................. 2010-017234

(51) Int. Cl.
*H03H 9/72* (2006.01)
*H03H 9/64* (2006.01)

(52) U.S. Cl.
USPC .............................. 333/133; 333/193; 333/195

(58) Field of Classification Search ................... 333/133, 333/193–196; 310/313 B, 313 D
See application file for complete search history.

(56) References Cited

U.S. PATENT DOCUMENTS

| 5,471,722 | A | * | 12/1995 | Yatsuda | .......................... 29/25.35 |
| 2003/0214368 | A1 | | 11/2003 | Taniguchi | |
| 2008/0061906 | A1 | * | 3/2008 | Omura et al. | .................. 333/133 |
| 2008/0224799 | A1 | * | 9/2008 | Taniguchi | ....................... 333/193 |

FOREIGN PATENT DOCUMENTS

| EP | 1 313 218 A1 | 5/2003 |
| JP | 2002-141771 A | 5/2002 |
| JP | 2003-332885 A | 11/2003 |
| JP | 2005-130341 A | 5/2005 |

OTHER PUBLICATIONS

English language machine translation of JP 2005-130341, published May 19, 2005 (9 pages).*
Official Communication issued in International Patent Application No. PCT/JP2010/062152, mailed on Sep. 14, 2010.

* cited by examiner

*Primary Examiner* — Barbara Summons
(74) *Attorney, Agent, or Firm* — Keating & Bennett, LLP

(57) ABSTRACT

A small-sized surface acoustic wave filter device having favorable filter characteristics includes a transmission-side surface acoustic wave filter chip including a ladder surface acoustic wave filter unit located on a piezoelectric substrate. The ladder surface acoustic wave filter unit includes a series arm connected between an input pad and an output pad and a plurality of resonators and including at least one first resonator connected to the input pad or the output pad. A die-attach surface is provided with an inductor connected to the first resonator. The inductor is arranged such that at least a portion thereof faces the first resonator and does not face any of the plurality of resonators and other than the first resonator.

6 Claims, 10 Drawing Sheets

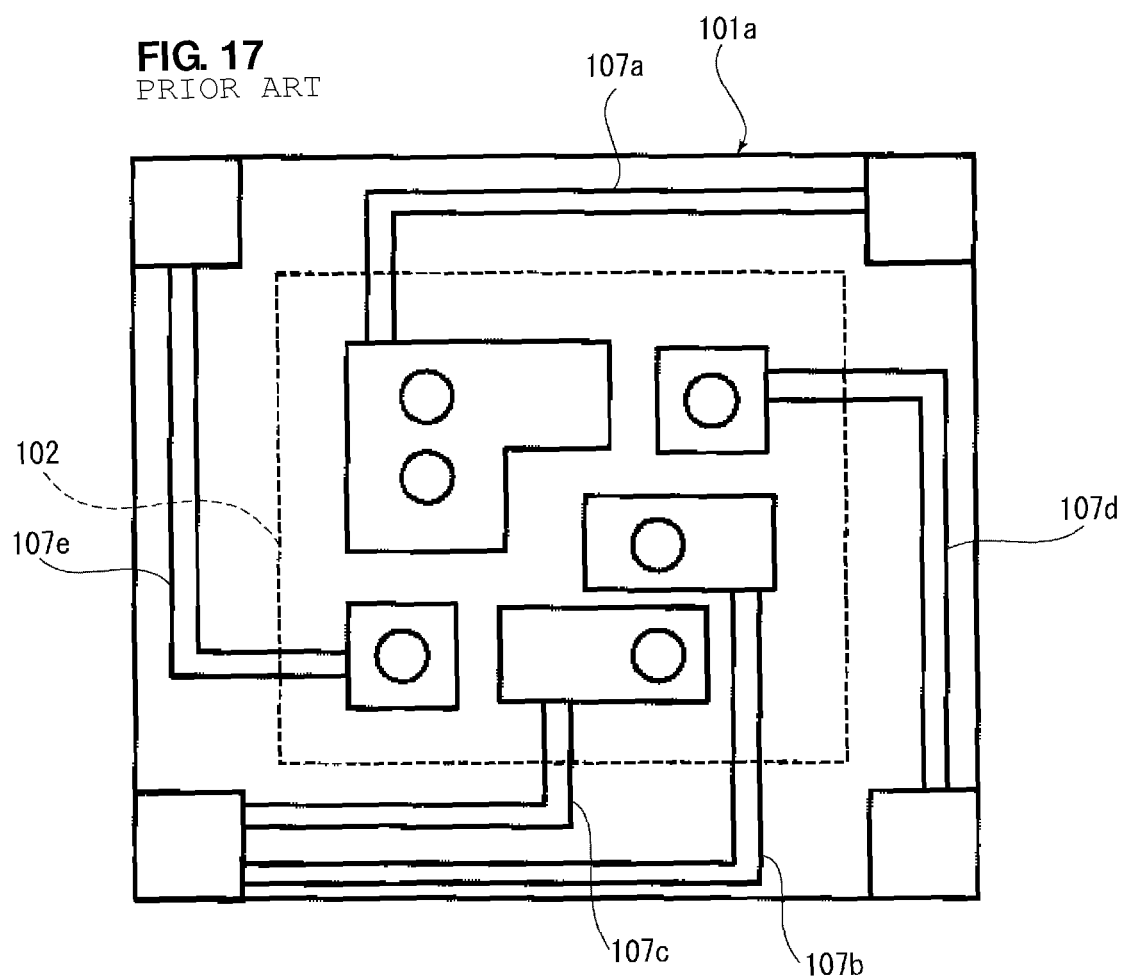

SURFACE ACOUSTIC WAVE FILTER DEVICE

BACKGROUND OF THE INVENTION

1. Field of the Invention

The present invention relates to a surface acoustic wave filter device. More particularly, the present invention relates to a surface acoustic wave filter device including a surface acoustic wave filter chip flip-chip mounted on a wiring board.

2. Description of the Related Art

In the past, a variety of surface acoustic wave filter devices using surface acoustic waves have been proposed, for example, in the following Japanese Unexamined Patent Application Publication No. 2002-141771 and so forth as a band pass filter or the like mounted on or in an RF (Radio Frequency) circuit of a communication device, such as a cellular phone.

FIG. 14 is a schematic cross-sectional view of a surface acoustic wave filter device described in Japanese Unexamined Patent Application Publication No. 2002-141771. As illustrated in FIG. 14, a surface acoustic wave filter device 100 includes a package 101 and a surface acoustic wave filter device 102 disposed in the package 101. The package 101 includes a base substrate 101a, side walls 101b, and a cap member 101c. The surface acoustic wave filter device 102 is flip-chip mounted on the base substrate 101a.

FIG. 15 is a schematic plan view of the surface acoustic wave filter device 102. FIG. 16 is a schematic circuit diagram of the surface acoustic wave filter device 100. FIG. 17 is a schematic plan view of the base substrate 101a. As illustrated in FIG. 15, the surface acoustic wave filter device 102 includes a piezoelectric substrate 102a and a ladder surface acoustic wave filter unit 102b formed on the piezoelectric substrate 102a. As illustrated in FIG. 16, the surface acoustic wave filter device 100 includes series arm resonators 104a and 104b connected in series in a series arm 103 (see FIG. 16) and parallel arm resonators 105a to 105c provided in parallel arms 106a to 106c connecting the series arm 103 and the ground potential. Between the parallel arm resonators 105a to 105c and the ground potential, inductors L101 to L103 (see FIG. 16) are provided. The series arm 103 is provided with inductors L104 and L105. The series arm resonators 104a and 104b and the parallel arm resonators 105a to 105c are formed on the piezoelectric substrate 102a, as illustrated in FIG. 15. Meanwhile, the inductors L101 to L105 are formed on the base substrate 101a, as illustrated in FIG. 17. Specifically, the inductors L101 to L105 are formed by wiring lines 107a to 107e formed on the base substrate 101a. The surface acoustic wave filter device 102 is flip-chip mounted on the base substrate 101a, and thus a surface of the base substrate 101a is a die-attach surface.

Meanwhile, it has been known in the past that it is possible in a ladder surface acoustic wave filter to improve filter characteristics by connecting inductors in series or parallel with series arm resonators or parallel arm resonators. Specifically, it is possible to widen the pass band and increase the attenuation near the pass band. In view of this, the inductors L101 to L105 are provided in, for example, the surface acoustic wave filter device 100 described in the above-described Japanese Unexamined Patent Application Publication No. 2002-141771 in terms of improvement of filter characteristics.

The inductors may be formed by chip inductors mounted on the base substrate or the like. In terms of a reduction in size of the surface acoustic wave filter device, however, it is preferred that the inductors are formed by wiring lines formed on the base substrate. As an area in the base substrate for forming the wiring lines forming the inductors, the interior of the base substrate or the die-attach surface of the base substrate is conceivable. If the wiring lines forming the inductors are formed in the interior of the base substrate, however, the distance between the wiring lines forming the inductors and the ground potential is reduced. It is therefore difficult to form inductors having a large inductance value. Accordingly, it is preferred that the wiring lines forming the inductors are formed on the die-attach surface of the base substrate, which is located at a position that is farthest from the ground potential.

If the wiring lines forming the inductors are formed on the die-attach surface of the base substrate, however, electromagnetic field coupling or capacitive coupling may occur between the wiring lines forming the inductors and the resonators formed on the piezoelectric substrate and degrade the filter characteristics. Therefore, in the surface acoustic wave filter device 100, for example, the wiring lines 107a to 107e forming the inductors L101 to L105 are formed in a peripheral portion of the surface of the base substrate 101a so as not to face the series arm resonators 104a and 104b and the parallel arm resonators 105a to 105c on the piezoelectric substrate 102a, as illustrated in FIGS. 15 to 17. In the surface acoustic wave filter device 100, therefore, it is necessary to increase the size of the base substrate 101a to secure the area for providing the wiring lines 107a to 107e forming the inductors L101 to L105, and there is an issue of an increase in size of the surface acoustic wave filter device. Further, particularly in a small-sized surface acoustic wave filter device, such as a CSP (Chip Size Package) surface acoustic wave filter device, it is difficult to secure the area for providing the wiring lines forming the inductors in the peripheral portion of the surface of the base substrate.

SUMMARY OF THE INVENTION

In view of the above-described issues, preferred embodiments of the present invention provide a small-sized surface acoustic wave filter device having favorable filter characteristics.

As a result of diligent studies, the inventor of the invention described and claimed in the present application discovered that, even if a specific inductor provided on a die-attach surface of a wiring board faces a specific resonator provided on the piezoelectric substrate, the filter characteristics are not substantially degraded. Specifically, the present inventor has discovered that, if a resonator connected to an input pad or an output pad and an inductor connected to the resonator face each other, the filter characteristics are not substantially degraded, and such discoveries led to the development of preferred embodiments of the present invention.

That is, a surface acoustic wave filter device according to a preferred embodiment of the present invention includes a wiring board including a die-attach surface and a surface acoustic wave filter chip. The surface acoustic wave filter chip is flip-chip mounted on the die-attach surface of the wiring board. The surface acoustic wave filter chip includes a piezoelectric substrate and a ladder surface acoustic wave filter unit located on the piezoelectric substrate. The ladder surface acoustic wave filter unit includes an input pad, an output pad, a series arm connected between the input pad and the output pad, and a plurality of resonators. The plurality of resonators include at least one first resonator connected to the input pad or the output pad. The die-attach surface of the wiring board is provided with an inductor connected to the first resonator. The inductor is arranged such that at least a portion thereof faces the first resonator but does not face any of the plurality of resonators other than the first resonator.

In a specific aspect of the surface acoustic wave filter device according to a preferred embodiment of the present invention, the wiring board includes an input terminal connected to the input pad and an output terminal connected to the output pad. The plurality of resonators include a plurality of series arm resonators and at least one parallel arm resonator. The plurality of series arm resonators are connected in series in the series arm. The at least one parallel arm resonator is connected between the series arm and a ground potential. The first resonator is one of the series arm resonators. The inductor is connected between the first resonator and the input terminal or between the first resonator and the output terminal.

In another specific aspect of the surface acoustic wave filter device according to a preferred embodiment of the present invention, the wiring board includes an input terminal connected to the input pad and an output terminal connected to the output pad. The plurality of resonators include a plurality of series arm resonators and at least one parallel arm resonator. The plurality of series arm resonators are connected in series in the series arm. The at least one parallel arm resonator is connected between the series arm and a ground potential. The first resonator is the parallel arm resonator. The inductor is connected between the first resonator and the input terminal or between the first resonator and the output terminal.

In a different specific aspect of the surface acoustic wave filter device according to a preferred embodiment of the present invention, the wiring board includes an input terminal connected to the input pad and an output terminal connected to the output pad. The plurality of resonators include a plurality of series arm resonators and at least one parallel arm resonator. The plurality of series arm resonators are connected in series in the series arm. The at least one parallel arm resonator is connected between the series arm and a ground potential. The first resonator is one of the series arm resonators. The inductor is connected in parallel with the first resonator.

In still another specific aspect of the surface acoustic wave filter device according to a preferred embodiment of the present invention, the wiring board includes an input terminal connected to the input pad and an output terminal connected to the output pad. The plurality of resonators include a plurality of series arm resonators and at least one parallel arm resonator. The plurality of series arm resonators are connected in series in the series arm. The at least one parallel arm resonator is connected between the series arm and a ground potential. The first resonator is the parallel arm resonator. The inductor is connected between the first resonator and the ground potential.

In a still different specific aspect of the surface acoustic wave filter device according to a preferred embodiment of the present invention, the surface acoustic wave filter device is a branching filter.

In a preferred embodiment of the present invention, the inductor connected to the at least one first resonator connected to the input pad or the output pad is arranged such that at least a portion thereof faces the first resonator but does not face any of the plurality of resonators other than the first resonator. It is therefore possible to increase an area in the die-attach surface of the wiring board to provide the inductor without increasing the size of the surface acoustic wave filter device, and to increase the inductance value of the inductor. Accordingly, it is possible to realize favorable filter characteristics and a reduction in size of the surface acoustic wave filter device.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 17 is a schematic plan view of a base substrate 101*a*.

DETAILED DESCRIPTION OF THE PREFERRED EMBODIMENTS

A preferred embodiment of the present invention will be described below with reference to, as an example, a duplexer illustrated in FIGS. 1 and 2, which is a type of surface acoustic wave filter device. The duplexer 1, however, is merely a non-limiting example of a preferred embodiment of the present invention. A surface acoustic wave filter device according to the present invention is not limited at all to the duplexer 1. A surface acoustic wave filter device according to various preferred embodiments of the present invention may include only one filter unit, for example, and may be a branching filter other than the duplexer, such as a triplexer, for example.

The duplexer 1 of the present preferred embodiment is preferably mounted on or in an RF (Radio Frequency) circuit of a cellular phone or the like supporting a CDMA (Code Division Multiple Access) system, such as UMTS (Universal Mobile Telecommunications System), for example. The duplexer 1 is a duplexer supporting UMTS-BAND2. The transmission frequency band of UMTS-BAND2 is 1850 MHz to 1910 MHz, and the reception frequency band of UMTS-BAND2 is 1930 MHz to 1990 MHz.

Figure 1:
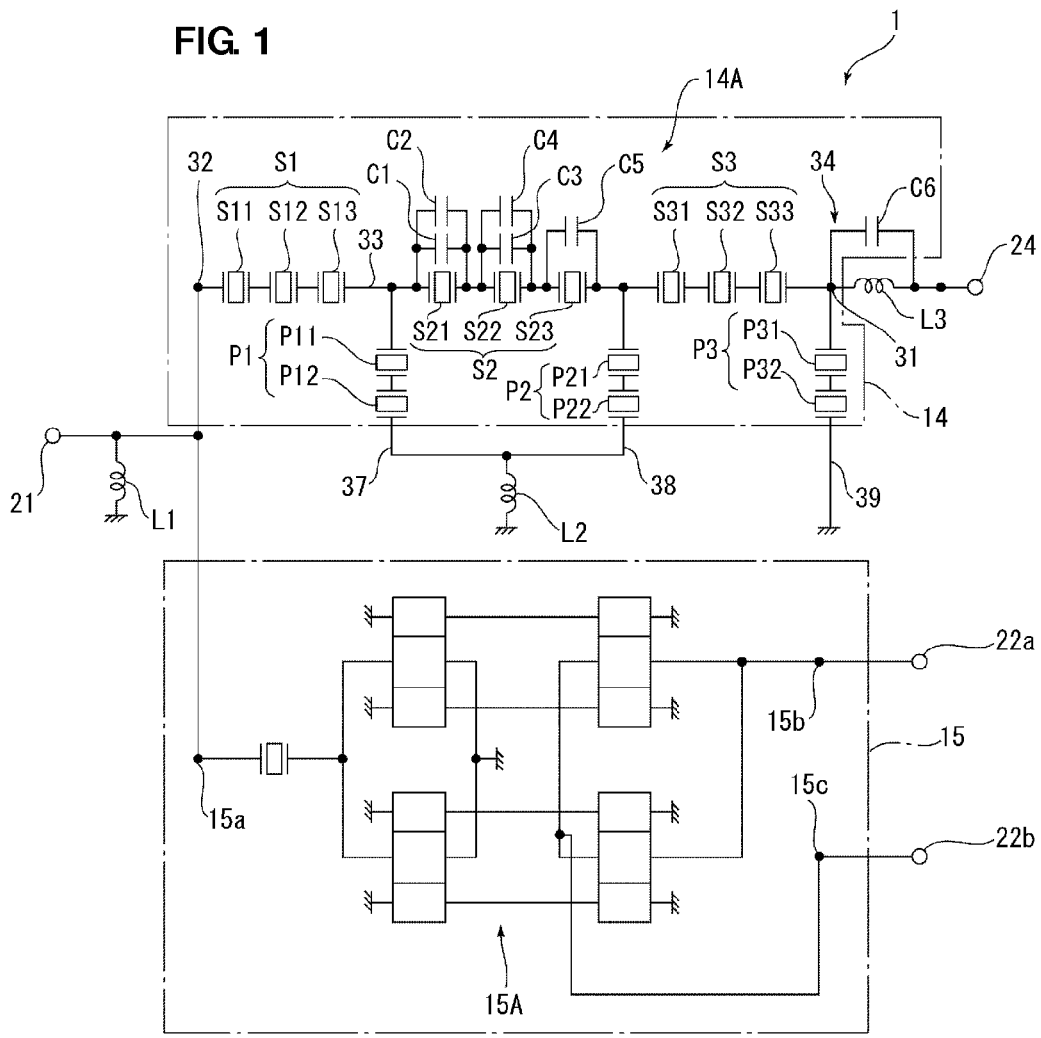
FIG. 1 is a schematic circuit diagram of a duplexer according to a preferred embodiment of the present invention.
Figure 2:
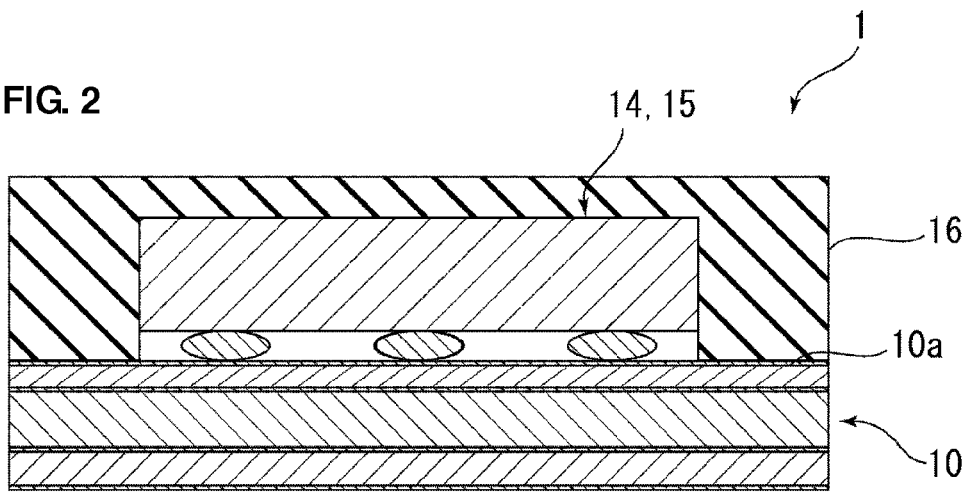
FIG. 2 is a schematic cross-sectional view of the duplexer according to a preferred embodiment of the present invention.

FIG. 1 is a schematic circuit diagram of the duplexer of the present preferred embodiment. FIG. 2 is a schematic cross-sectional view of the duplexer 1 of the present preferred embodiment. As illustrated in FIGS. 1 and 2, the duplexer 1 includes a wiring board 10, a transmission-side surface acoustic wave filter chip 14, and a reception-side surface acoustic wave filter chip 15. The transmission-side surface acoustic wave filter chip 14 and the reception-side surface acoustic wave filter chip 15 are flip-chip mounted on a die-attach surface 10a of the wiring board 10. On the wiring board 10, a sealing resin layer 16 is arranged to cover the transmission-side surface acoustic wave filter chip 14 and the reception-side surface acoustic wave filter chip 15. That is, the duplexer 1 of the present preferred embodiment preferably is a CSP surface acoustic wave filter device.

The reception-side surface acoustic wave filter chip includes a longitudinally coupled resonator-type surface acoustic wave filter unit 15A located on a not-illustrated piezoelectric substrate. In the duplexer 1 of the present preferred embodiment, this longitudinally coupled resonator-type surface acoustic wave filter unit 15A defines a reception-side filter. The longitudinally coupled resonator-type surface acoustic wave filter unit 15A is a filter unit having a balanced-unbalanced transforming function. An unbalanced signal terminal 15a of the longitudinally coupled resonator-type surface acoustic wave filter unit 15A is connected to an antenna terminal 21 located on the wiring board 10, and first and second balanced signal terminals 15b and 15c of the longitudinally coupled resonator-type surface acoustic wave filter unit 15A are respectively connected to first and second reception-side signal terminals 22a and 22b located on the wiring board 10. In the present preferred embodiment, the impedance of the unbalanced signal terminal 15a preferably is about 50Ω, for example. The impedance of the first and second balanced signal terminals 15b and 15c preferably is about 100Ω, for example. In the duplexer 1 of the present preferred embodiment, the reception-side filter is defined by the longitudinally coupled resonator-type surface acoustic wave filter unit 15A. The reception-side filter, however, may be defined by a ladder surface acoustic wave filter unit.

A matching inductor L1 is connected between a connection point of the antenna terminal 21 and the unbalanced signal terminal 15a and the ground potential.

The transmission-side surface acoustic wave filter chip 14 includes a ladder surface acoustic wave filter unit 14A. In the duplexer 1 of the present preferred embodiment, the ladder surface acoustic wave filter unit 14A defines a transmission-side filter. As illustrated in FIG. 1, the ladder surface acoustic wave filter unit 14A is connected between the antenna terminal 21 located on the wiring board 10 and a transmission-side signal terminal 24 located on the wiring board 10. The ladder surface acoustic wave filter unit 14A includes a series arm 33 connecting the antenna terminal 21 and the transmission-side signal terminal 24. In the series arm 33, series arm resonators S1 to S3 are connected in series. The series arm resonator S1 is defined by surface acoustic wave resonators S11 to S13. The series arm resonator S2 is defined by surface acoustic wave resonators S21 to S23. The series arm resonator S3 is defined by surface acoustic wave resonators S31 to S33. Each of the series arm resonators S1 to S3 is defined by a plurality of surface acoustic wave resonators, but functions as one resonator. With each of the series arm resonators S1 to S3 thus defined by a plurality of surface acoustic wave resonators, the ladder surface acoustic wave filter unit 14A has high electric power handling capability. Each of the series arm resonators S1 to S3 may be defined by a single surface acoustic wave resonator.

Capacitors C1 to C5 are connected in parallel with the surface acoustic wave resonators S21 to S23 defining the series arm resonator S2. With these capacitors C1 to C5, the anti-resonant frequency of the series arm resonator S2 shifts toward the low frequency side. With the provision of the capacitors C1 to C5, therefore, the steepness of the filter characteristics of the transmission-side filter is increased.

An LC resonant circuit 34 defined by an inductor L3 and a capacitor C6 connected in parallel is connected between the series arm resonator S3 and the transmission-side signal terminal 24. An attenuation pole defined by the LC resonant circuit 34 is located on the higher side of the pass band of the transmission-side filter. With the provision of the LC resonant circuit 34, therefore, the attenuation on the higher side of the pass band of the transmission-side filter is increased.

The ladder surface acoustic wave filter unit 14A includes parallel arms 37 to 39 connected between the series arm and the ground potential. The parallel arms 37 to 39 are respectively provided with parallel arm resonators P1 to P3. The parallel arm resonator P1 is defined by surface acoustic wave resonators P11 and P12. The parallel arm resonator P2 is defined by surface acoustic wave resonators P21 and P22. The parallel arm resonator P3 is defined by surface acoustic wave resonators P31 and P32. Each of the parallel arm resonators P1 to P3 is defined by a plurality of surface acoustic wave resonators, but functions as one resonator. With each of the parallel arm resonators P1 to P3 thus defined by a plurality of surface acoustic wave resonators, the ladder surface acoustic wave filter unit 14A has high electric power handling capability. Each of the parallel arm resonators P1 to P3 may be defined by a single surface acoustic wave resonator.

An inductor L2 is connected between the parallel arm resonators P1 and P2 and the ground potential. With this inductor L2, it is possible to increase the attenuation on the lower side of the pass band of the transmission-side filter.

Figure 3:
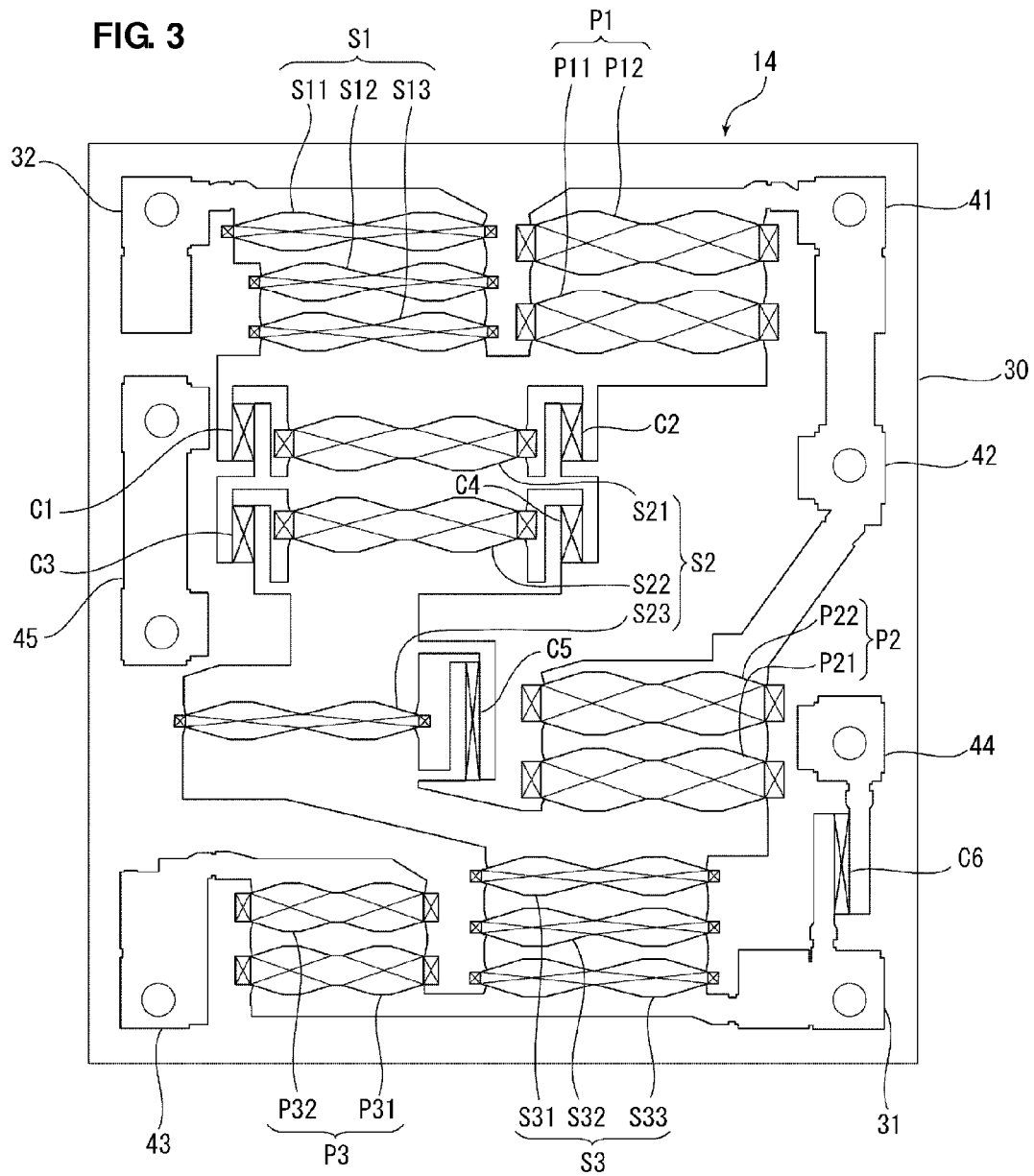
FIG. 3 is a schematic perspective plan view illustrating an electrode structure of a transmission-side surface acoustic wave filter chip in the duplexer according to a preferred embodiment of the present invention.
Figure 4:
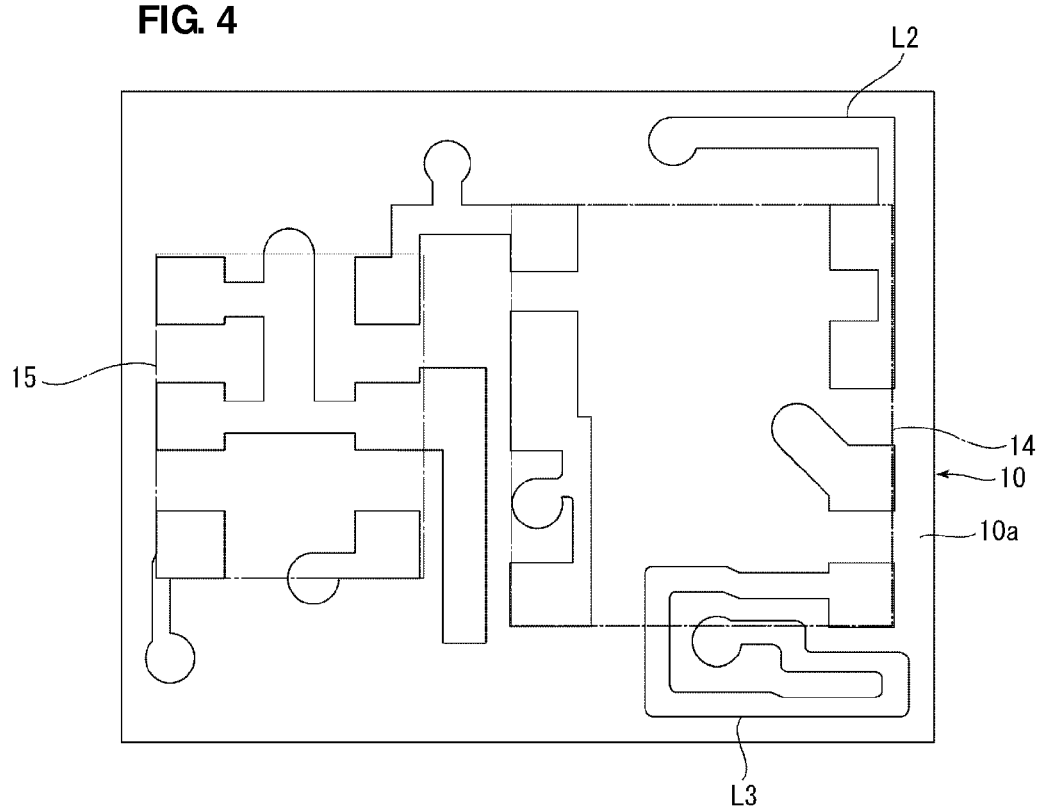
FIG. 4 is a schematic plan view of a die-attach surface of a wiring board in the duplexer according to a preferred embodiment of the present invention.
Figure 5:
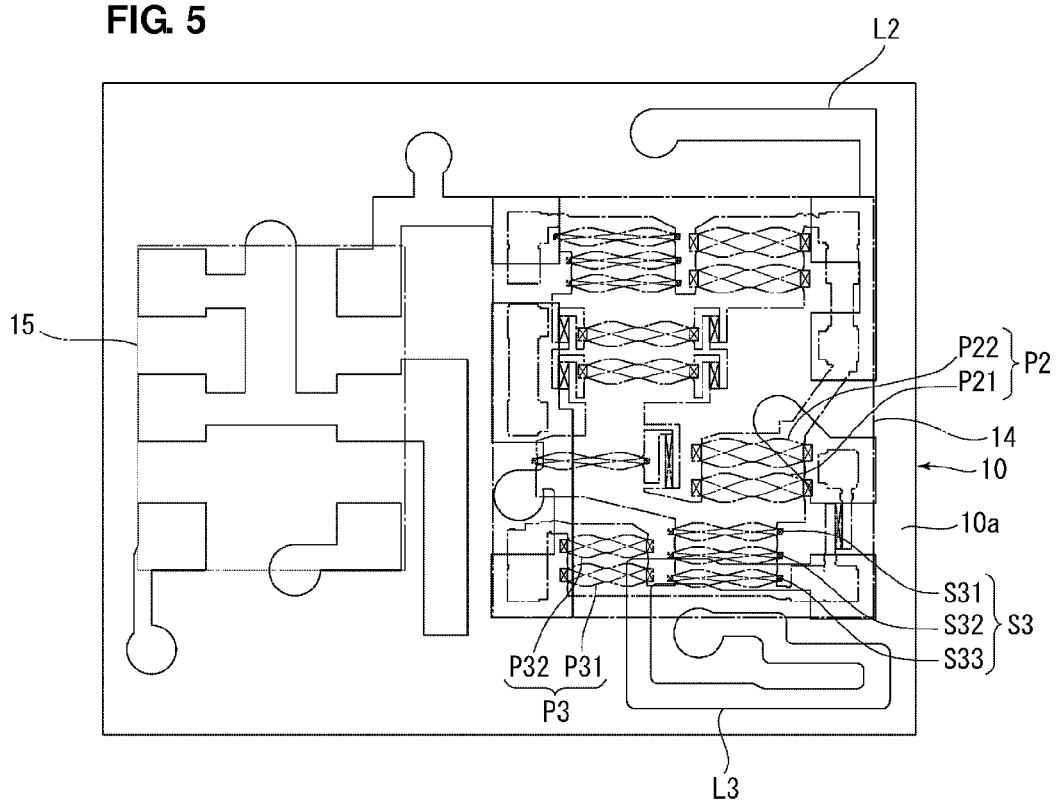
FIG. 5 is a schematic perspective plan view of the duplexer according to a preferred embodiment of the present invention.

Subsequently, a specific configuration of the ladder surface acoustic wave filter unit 14A will be described mainly with reference to FIGS. 3 to 5. FIG. 3 is a schematic perspective plan view illustrating an electrode structure of the transmission-side surface acoustic wave filter chip 14 in the duplexer 1 of the present preferred embodiment. Specifically, FIG. 3 illustrates the electrode structure of the transmission-side surface acoustic wave filter chip 14 when the transmission-side surface acoustic wave filter chip 14 is seen through from above the duplexer 1. FIG. 4 is a schematic plan view of the die-attach surface 10a of the wiring board 10 in the duplexer 1 of the present preferred embodiment. FIG. 5 is a schematic perspective plan view of the duplexer 1 of the present preferred embodiment. Specifically, FIG. 5 illustrates the duplexer 1 as seen through from above.

As illustrated in FIG. 3, the transmission-side surface acoustic wave filter chip 14 includes a piezoelectric substrate 30. On the piezoelectric substrate 30, an output pad connected to the antenna terminal 21, an input pad 31 connected to the transmission-side signal terminal 24, the series arm resonators S1 to S3, the parallel arm resonators P1 to P3, the capacitors C1 to C6, ground pads 41 to 43 connected to the ground potential, an electrode pad 44, and a dummy pad 45 are provided.

The surface acoustic wave resonators S11 to S13, S21 to S23, and S31 to S33 defining the series arm resonators S1 to S3 and the surface acoustic wave resonators P11, P12, P21, P22, P31, and P32 defining the parallel arm resonators P1 to P3 are each defined by one interdigital transducer and a pair of reflectors disposed on the opposite sides of the interdigital transducer. The capacitors C1 to C6 are preferably defined by comb-shaped electrodes. On the input pad 31, the output pad 32, the ground pads 41 to 43, the electrode pad 44, and the dummy pad 45, bumps are provided. Circles in FIG. 3 represent the bumps. The piezoelectric substrate 30 may be a piezoelectric single crystal substrate made of $LiNbO_3$, $LiTaO_3$, or other suitable material, for example.

As illustrated in FIG. 4, the die-attach surface 10a of the wiring board 10 is provided with a plurality of electrodes and the inductors L2 and L3 defined by wiring lines. The plurality of electrodes are connected to electrode patterns of the transmission-side surface acoustic wave filter chip 14 and the reception-side surface acoustic wave filter chip 15 by the bumps. The inductor L2 is arranged so as not to face the transmission-side surface acoustic wave filter chip 14. Meanwhile, the inductor L3 is arranged such that a portion of the inductor L3 faces the transmission-side surface acoustic wave filter chip 14. Specifically, as illustrated in FIG. 5, the inductor L3 is arranged such that a portion of the inductor L3 faces the series arm resonator S3 and the parallel arm resonator P3 connected to the input pad 31.

In the present preferred embodiment, the inductors L2 and L3 are disposed on a portion of the die-attach surface 10a of the wiring board 10, which is located at a position most distant from the ground potential. It is therefore possible to increase the inductance values of the inductors L2 and L3 without an increase in size of the inductors L2 and L3, as compared with, for example, a case where the inductors L2 and L3 are formed in the interior of the wiring board 10.

Further, the inductor L3 is arranged such that a portion thereof faces the series arm resonator S3 and the parallel arm resonator P3. It is therefore possible to increase the area to provide the inductor L3 without an increase in size of the wiring board 10, as compared with a case where the inductor L3 is disposed so as not to face the transmission-side surface acoustic wave filter chip 14 including the series arm resonator S3 and the parallel arm resonator P3. Accordingly, it is possible to increase the inductance value of the inductor L3.

Further, the inductor L3 faces the series arm resonator S3 and the parallel arm resonator P3 connected to the input pad 31, but does not face the other resonators S1, S2, P1, and P2 and the capacitors C1 to C6. It is therefore possible to significantly reduce and prevent the degradation of the filter characteristics of the transmission-side filter. This effect will be described in further detail below with reference to a specific example.

Figure 6:
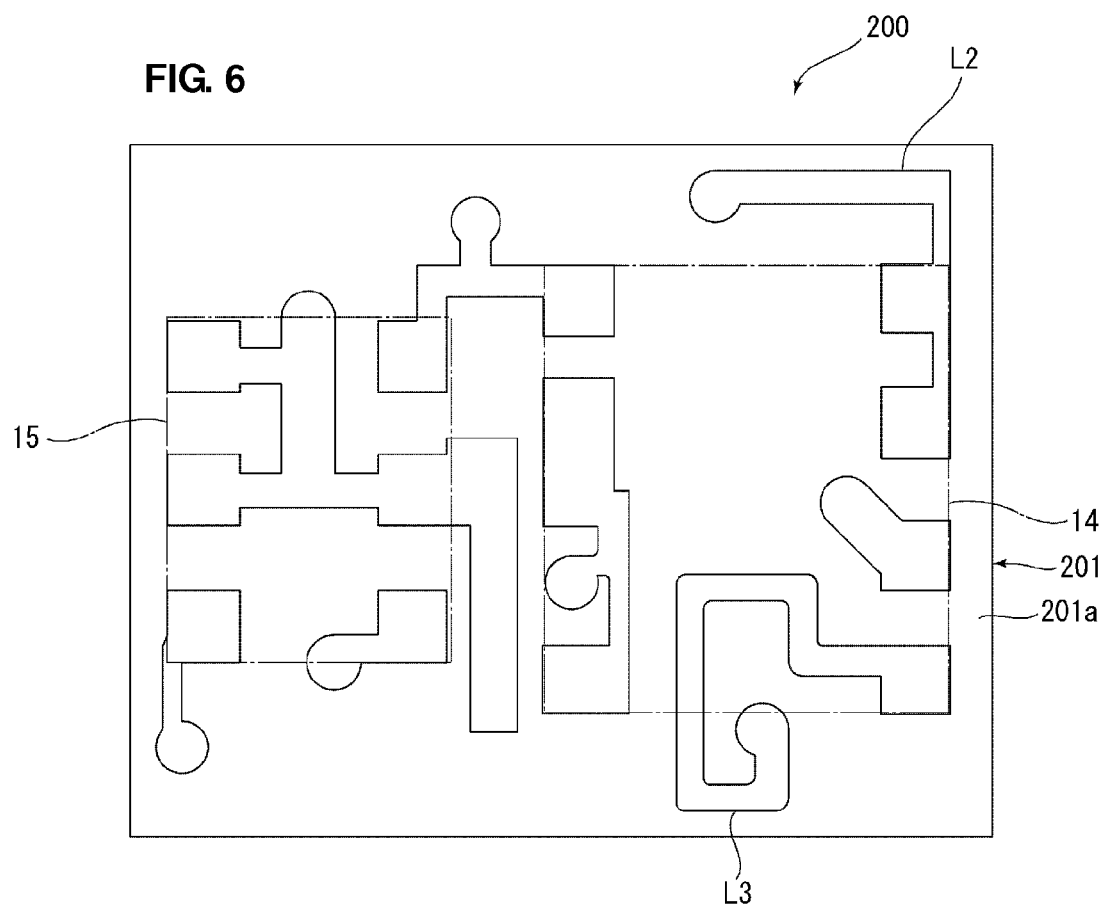
FIG. 6 is a schematic plan view of a die-attach surface of a wiring board in a duplexer according to a comparative example.
Figure 7:
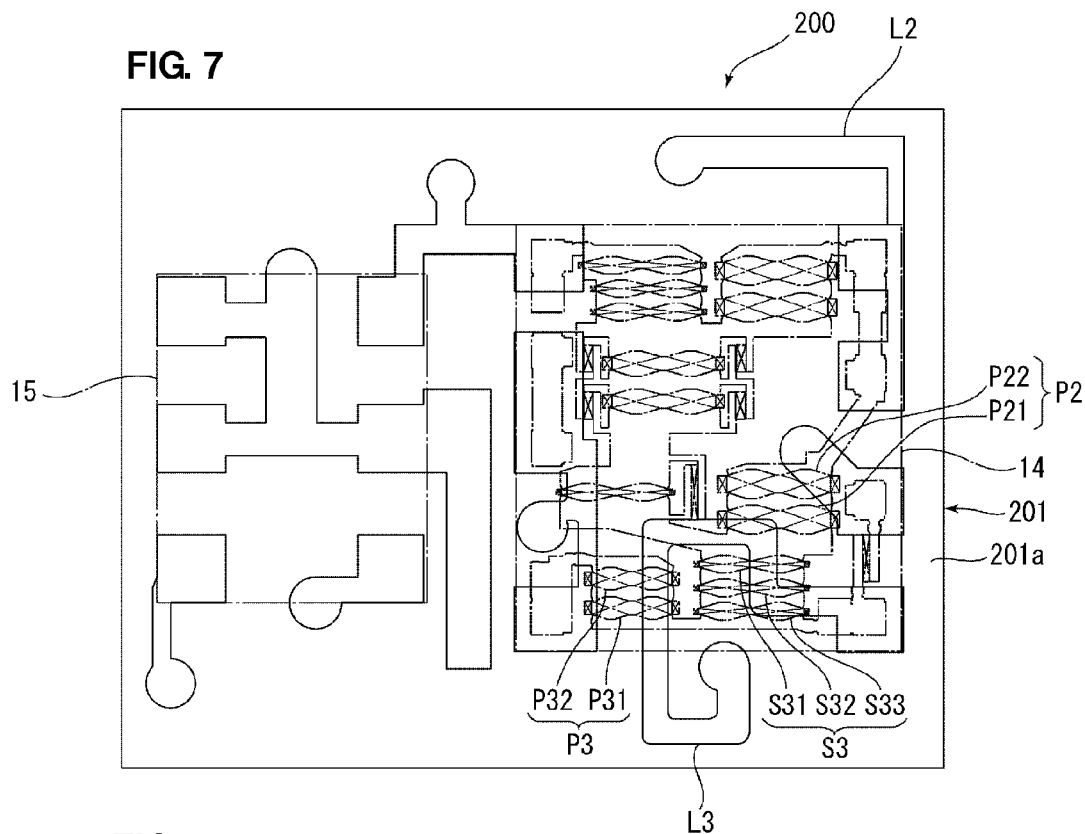
FIG. 7 is a schematic perspective plan view of the duplexer according to the comparative example.

A sample of the duplexer 1 of the present preferred embodiment was produced, and a duplexer 200 different therefrom only in the shape of the inductor L3 was produced as a comparative example of the duplexer 1. FIG. 6 is a schematic plan view of a die-attach surface 201a of a wiring board 201 in the duplexer 200 of the comparative example. FIG. 7 is a schematic perspective plan view of the duplexer 200 of the comparative example. Specifically, FIG. 7 illustrates the duplexer 200 of the comparative example as seen through from above. As illustrated in FIGS. 6 and 7, in the duplexer 200 of the comparative example, the inductor L3 is formed such that a portion of the inductor L3 faces not only the series arm resonator S3 and the parallel arm resonator P3 but also the parallel arm resonator P2.

Figure 8:
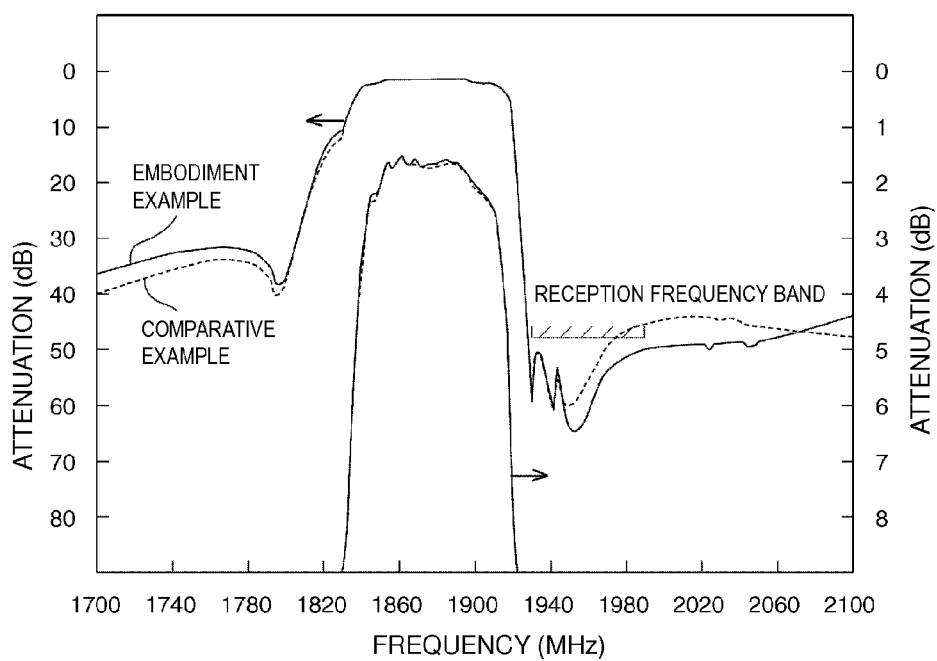
FIG. 8 is graphs illustrating transmission characteristics of a transmission-side filter in the duplexer according to a preferred embodiment of the present invention and transmission characteristics of a transmission-side filter in the duplexer according to the comparative example.

FIG. 8 illustrates transmission characteristics of the transmission-side filter in the duplexer 1 of the present preferred embodiment and transmission characteristics of a transmission-side filter in the duplexer 200 of the comparative example.

As is clear from the results illustrated in FIG. 8, in the transmission-side filter in the duplexer 200 of the comparative example, the minimum value of the attenuation was approximately 45.4 dB in the reception frequency band of 1930 MHz to 1990 MHz. Meanwhile, in the transmission-side filter in the duplexer 1 of the present preferred embodiment, the minimum value of the attenuation was approximately 49.8 dB in the reception frequency band of 1930 MHz to 1990 MHz, and the minimum value of the attenuation is greater than that of the duplexer 200 of the comparative example by approximately 4.4 dB. That is, in the transmission-side filter in the duplexer 1 of the present preferred embodiment, the attenuation on the higher side of the pass band is greater than that of the transmission-side filter in the duplexer 200 of the comparative example. It is understood from this result that the inductor L3 facing the series arm resonator S3 and the parallel arm resonator P3 connected to the input pad 31 does not result in a reduction in attenuation on the higher side of the pass band, but that the inductor L3 facing a resonator other than the series arm resonator S3 and the parallel arm resonator P3 results in a substantial reduction in attenuation on the higher side of the pass band.

Figure 9:
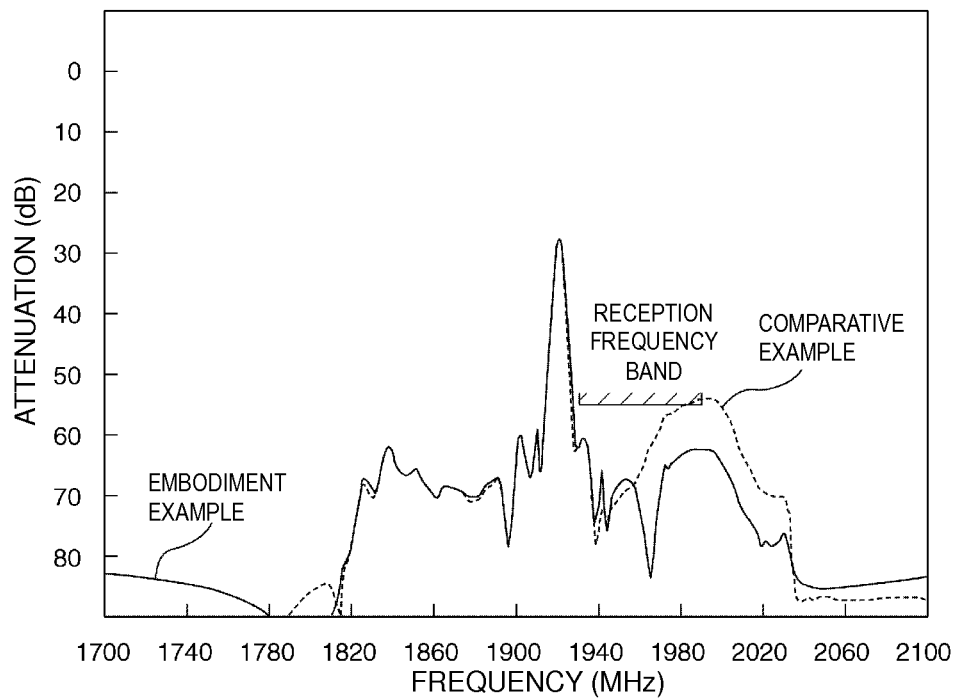
FIG. 9 is graphs illustrating an isolation characteristic in the duplexer according to a preferred embodiment of the present invention and an isolation characteristic in the duplexer according to the comparative example.

FIG. 9 illustrates an isolation characteristic in the duplexer 1 of the present preferred embodiment and an isolation characteristic in the duplexer 200 of the comparative example. The isolation characteristics illustrated in FIG. 9 are isolation characteristics between the transmission-side signal terminal 24 and the first and second reception-side signal terminals 22a and 22b.

As is clear from the results illustrated in FIG. 9, in the duplexer 200 of the comparative example, the minimum value of the attenuation was approximately 53 dB in the reception frequency band of 1930 MHz to 1990 MHz. Meanwhile, in the duplexer 1 of the present preferred embodiment, the minimum value of the attenuation was approximately 60 dB in the reception frequency band of 1930 MHz to 1990 MHz, and the isolation characteristic was more favorable than that of the duplexer 200 of the comparative example by approximately 7 dB. It is understood from this result that the inductor L3 facing the series arm resonator S3 and the parallel arm resonator P3 connected to the input pad 31 does not result in degradation of the isolation characteristic, but that the inductor L3 facing a resonator other than the series arm resonator S3 and the parallel arm resonator P3 results in substantial degradation of the isolation characteristic.

It is understood from the above that, if an inductor connected to a resonator connected to the input pad or the output pad is provided on the die-attach surface of the wiring board such that at least a portion of the inductor faces the resonator, it is possible to realize favorable filter characteristics without increasing the size of the surface acoustic wave filter device.

The lack of degradation of the filter characteristics even when an inductor connected to a resonator connected to the input pad or the output pad is disposed to face the resonator is considered to be due to the following reason.

If a resonator on the piezoelectric substrate and an inductor on the wiring board face each other, capacitive coupling or electromagnetic field coupling occurs between the resonator and the inductor. In some cases, therefore, a path due to the capacitive coupling or electromagnetic field coupling is generated between the resonator and the inductor via the space between the resonator and the inductor. In general, the formation of this path allows some of signals to flow not via a desired path, and thus the filter characteristics are degraded. For example, in the case of the duplexer 200 of the comparative example, the inductor L3 located on the die-attach surface 201a of the wiring board 201 faces the parallel arm resonator P2 formed on the piezoelectric substrate 30 of the transmission-side surface acoustic wave filter chip 14. Thus, capacitive coupling or electromagnetic field coupling occurs between the inductor L3 and the parallel arm resonator P2. As a result, a path due to the capacitive coupling or electromagnetic field coupling is generated between the inductor L3 and the parallel arm resonator P2. This path allows some of signals to directly flow from the input pad 31 to the parallel arm resonator P2 not via the series arm resonator S3. This results in degradation of the filter characteristics, such as the reduction in attenuation on the higher side of the pass band of the transmission-side filter in the duplexer 200 of the comparative example and the degradation of the isolation characteristic of the duplexer 200 of the comparative example.

Meanwhile, in the duplexer 1 of the present preferred embodiment, the inductor L3 located on the die-attach surface 10a of the wiring board 10 is arranged to face the series arm resonator S3 and the parallel arm resonator P3 located on the piezoelectric substrate 30 of the transmission-side surface acoustic wave filter chip 14, but not to face the other resonators S1, S2, P1, and P2 and the capacitors C1 to C6. Therefore, capacitive coupling or electromagnetic field coupling may occur between the inductor L3 and the series arm resonator S3 and between the inductor L3 and the parallel arm resonator P3, but does not occur between the inductor L3 and the other resonators S1, S2, P1, and P2 and the capacitors C1 to C6. Thus, a path allowing some of signals to directly flow from the input pad 31 to the other resonators S1, S2, P1, and P2 and the capacitors C1 to C6 not via a desired path is not provided. In the duplexer 1 of the present preferred embodiment, therefore, the filter characteristics, such as the attenuation on the higher side of the pass band of the transmission-side filter and the isolation characteristic, are not easily degraded.

In the present preferred embodiment, a description has been provided of the case where a portion of the inductor L3 faces the series arm resonator S3 and the parallel arm resonator P3. For example, however, the inductor L3 may be arranged such that a portion of the inductor L3 faces only one of the series arm resonator S3 and the parallel arm resonator P3.

In the following, modified examples of the above-described preferred embodiment will be described. In the following description of the modified examples, members substantially common in function to those of the above-described first preferred embodiment will be referred to by common reference signs, and description thereof will be omitted.

Figure 10:
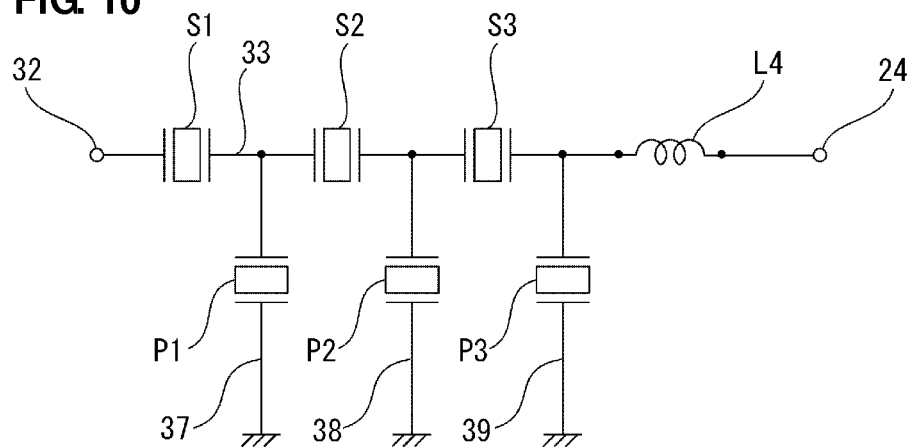
FIG. 10 is a schematic circuit diagram of a transmission-side filter in a duplexer according to a first modified example of a preferred embodiment of the present invention.
Figure 11:
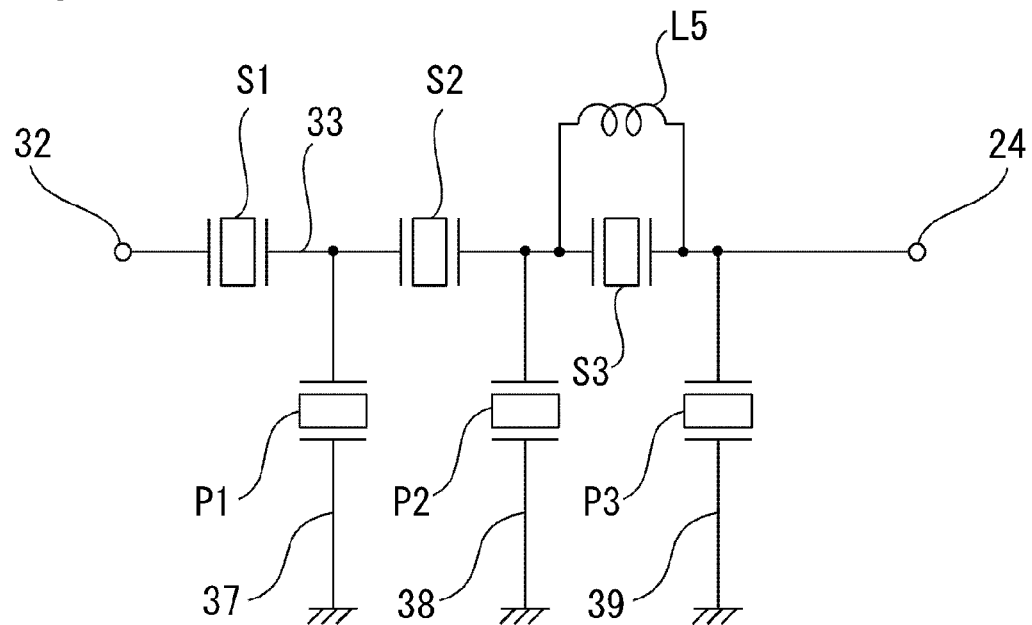
FIG. 11 is a schematic circuit diagram of a transmission-side filter in a duplexer according to a second modified example of a preferred embodiment of the present invention.
Figure 12:
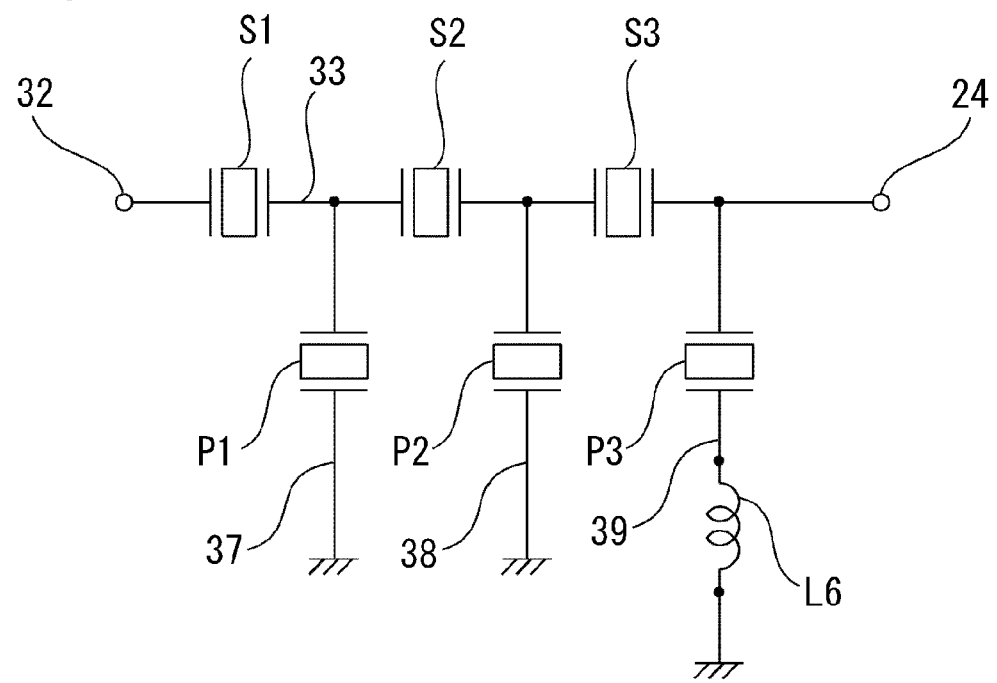
FIG. 12 is a schematic circuit diagram of a transmission-side filter in a duplexer according to a third modified example of a preferred embodiment of the present invention.
Figure 13:
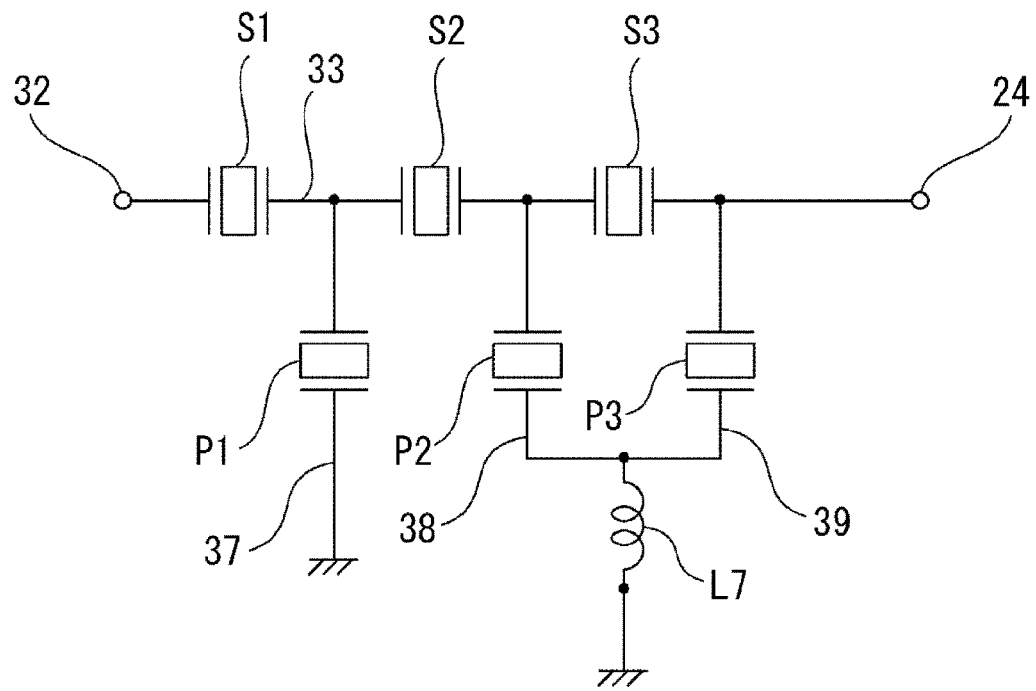
FIG. 13 is a schematic circuit diagram of a transmission-side filter in a duplexer according to a fourth modified example of a preferred embodiment of the present invention.
Figure 14:
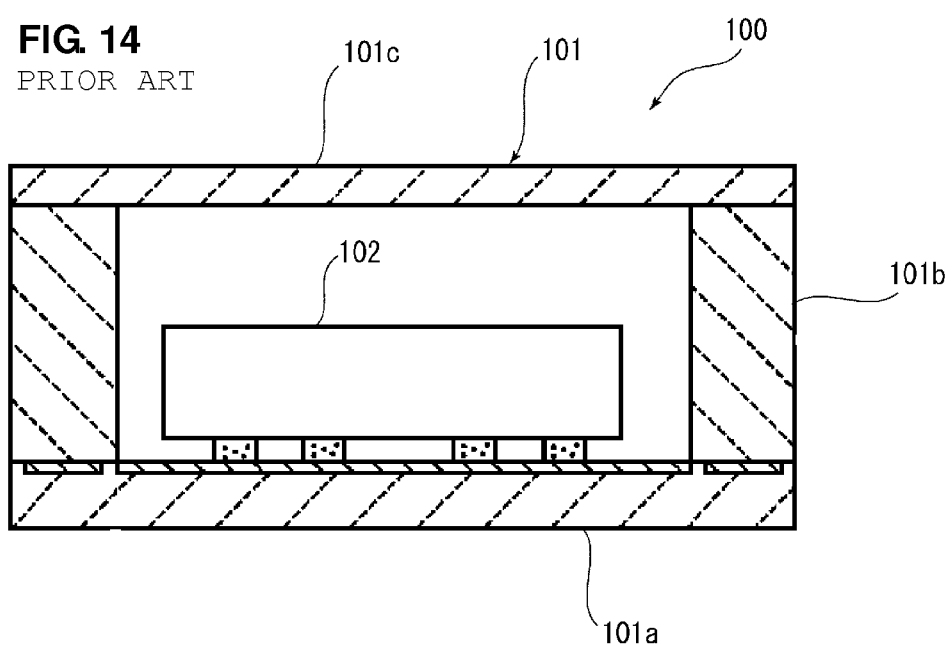
FIG. 14 is a schematic cross-sectional view of a surface acoustic wave filter device described in Japanese Unexamined Patent Application Publication No. 2002-141771.
Figure 15:
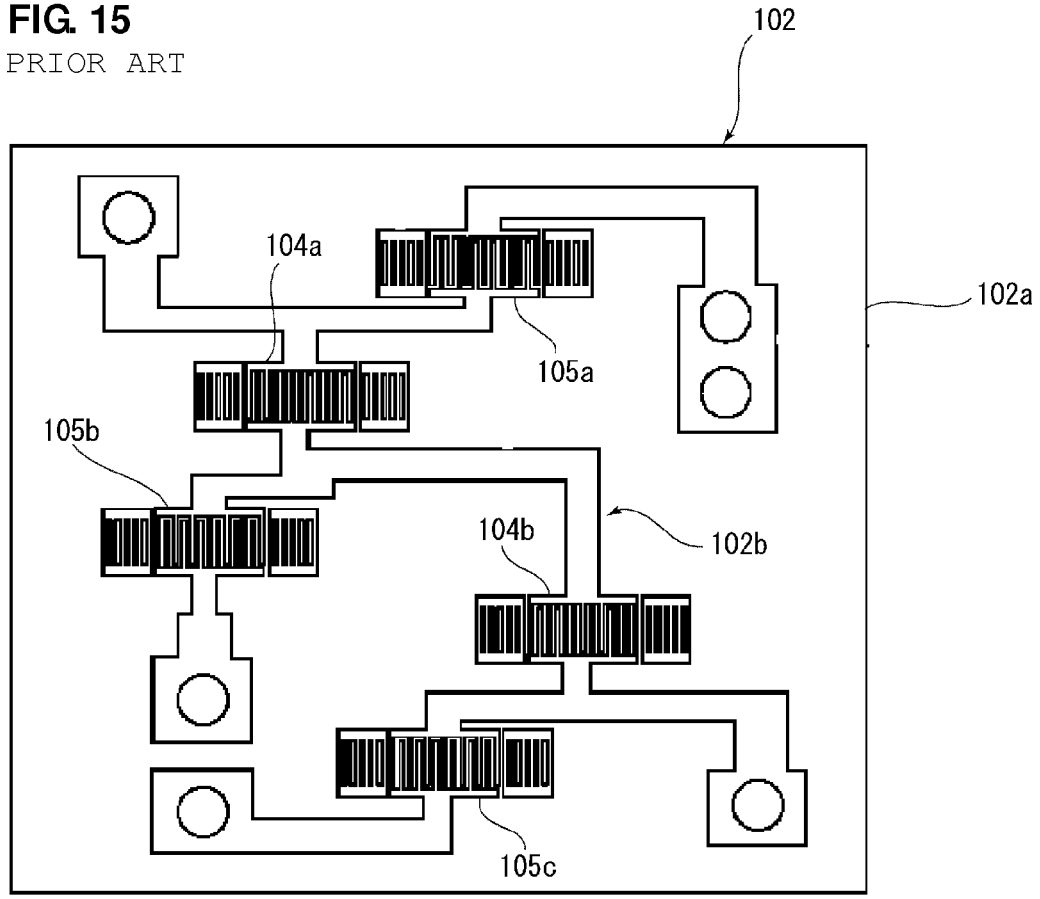
FIG. 15 is a schematic plan view of a surface acoustic wave filter device 102.
Figure 16:
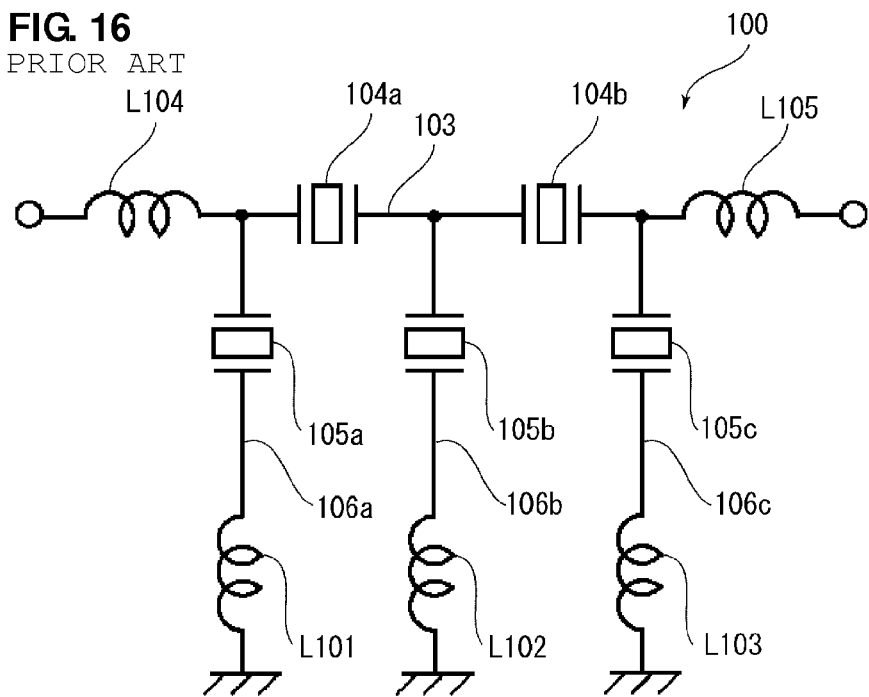
FIG. 16 is a schematic circuit diagram of the surface acoustic wave filter device 100.

FIG. 10 is a schematic circuit diagram of a transmission-side filter in a duplexer according to a first modified example of a preferred embodiment of the present invention. FIG. 11 is a schematic circuit diagram of a transmission-side filter in a duplexer according to a second modified example of a preferred embodiment of the present invention. FIG. 12 is a schematic circuit diagram of a transmission-side filter in a duplexer according to a third modified example of a preferred embodiment of the present invention. FIG. 13 is a schematic circuit diagram of a transmission-side filter in a duplexer according to a fourth modified example of a preferred embodiment of the present invention.

In the above-described preferred embodiment, description has been made of a non-limiting example in which an inductor located on the die-attach surface of the wiring board and facing resonators located on the piezoelectric substrate forms an LC resonant circuit. The inductor, however, may be one of the following inductors.

As illustrated in FIG. 10, an impedance matching inductor L4, which is connected to the series arm resonator S3 and the parallel arm resonator P3 and is also connected to the transmission-side signal terminal 24 serving as an input terminal of the transmission-side filter, may be disposed on the die-attach surface 10a of the wiring board 10 such that at least a portion of the inductor L4 faces one or both of the series arm resonator S3 and the parallel arm resonator P3.

Further, as illustrated in FIG. 11, an inductor L5, which is connected in parallel with the series arm resonator S3, may be disposed on the die-attach surface 10a of the wiring board 10 such that at least a portion of the inductor L5 faces one or both of the series arm resonator S3 and the parallel arm resonator P3.

Further, as illustrated in FIG. 12, an inductor L6, which is connected between the parallel arm resonator P3 and the ground potential, may be disposed on the die-attach surface 10a of the wiring board 10 such that at least a portion of the inductor L6 faces one or both of the series arm resonator S3 and the parallel arm resonator P3.

Further, as illustrated in FIG. 13, an inductor L7, which is connected between a connection point of the parallel arm resonator P3 and the parallel arm resonator P2 and the ground potential, may be disposed on the die-attach surface 10a of the wiring board 10 such that at least a portion of the inductor L7 faces one or both of the series arm resonator S3 and the parallel arm resonator P3.

The first preferred embodiment and the first to fourth modified examples of preferred embodiments of the present invention described above have a configuration in which an inductor is connected to a resonator located on the piezoelectric substrate and connected to the input pad, and is arranged on the die-attach surface of the wiring board such that at least a portion of the inductor faces the resonator. The present invention, however, is not limited to such a configuration. Even in a configuration in which an inductor is connected to a resonator located on the piezoelectric substrate and connected to the output pad, and is arranged on the die-attach surface of the wiring board such that at least a portion of the inductor faces the resonator, it is possible to realize favorable filter characteristics without increasing the size of the surface acoustic wave filter device.

In the first preferred embodiment and the first to fourth modified examples of preferred embodiments of the present invention described above, description has been made of the example in which the transmission-side filter of the duplexer is defined by a ladder surface acoustic wave filter. In the present invention, however, a ladder surface acoustic wave filter may define the reception-side filter of the duplexer.

Further, in the first preferred embodiment and the first to fourth modified examples of preferred embodiments of the present invention described above, the duplexer has been taken as an example of a surface acoustic wave filter device according to a preferred embodiment of the prevent invention. However, a surface acoustic wave filter device according to the prevent invention may not be a branching filter, but may be an interstage filter mounted in or on an RF circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter device comprising:
   a wiring board including a die-attach surface; and
   a surface acoustic wave filter chip flip-chip mounted on the die-attach surface of the wiring board; wherein
   the surface acoustic wave filter chip includes a piezoelectric substrate and a ladder surface acoustic wave filter unit located on the piezoelectric substrate;
   the ladder surface acoustic wave filter unit includes an input pad, an output pad, a series arm connecting the input pad and the output pad, and a plurality of resonators including at least one first resonator connected to the input pad or the output pad;
   the die-attach surface of the wiring board is provided with an inductor connected to the first resonator;
   the inductor is arranged such that at least a portion thereof faces the first resonator but does not face any of the plurality of resonators other than the first resonator;
   the wiring board includes an input terminal connected to the input pad and an output terminal connected to the output pad;
   the plurality of resonators include a plurality of series arm resonators connected in series in the series arm and at least one parallel arm resonator connected between the series arm and a ground potential;
   the first resonator is one of the plurality of series arm resonators; and
   the inductor is connected between the first resonator and the input terminal or between the first resonator and the output terminal.

2. The surface acoustic wave filter device described in claim 1, wherein the surface acoustic wave filter device is a branching filter.

3. A surface acoustic wave filter device comprising:
   a wiring board including a die-attach surface; and
   a surface acoustic wave filter chip flip-chip mounted on the die-attach surface of the wiring board; wherein
   the surface acoustic wave filter chip includes a piezoelectric substrate and a ladder surface acoustic wave filter unit located on the piezoelectric substrate;
   the ladder surface acoustic wave filter unit includes an input pad, an output pad, a series arm connecting the input pad and the output pad, and a plurality of resonators including at least one first resonator connected to the input pad or the output pad;
   the die-attach surface of the wiring board is provided with an inductor connected to the first resonator;
   the inductor is arranged such that at least a portion thereof faces the first resonator but does not face any of the plurality of resonators other than the first resonator;
   the wiring board includes an input terminal connected to the input pad and an output terminal connected to the output pad;
   the plurality of resonators include a plurality of series arm resonators connected in series in the series arm and at least one parallel arm resonator connected between the series arm and a ground potential;
   the first resonator is one of the at least one parallel arm resonator; and
   the inductor is connected between the first resonator and the input terminal or between the first resonator and the output terminal.

4. The surface acoustic wave filter device described in claim 3, wherein the surface acoustic wave filter device is a branching filter.

5. A surface acoustic wave filter device comprising:
   a wiring board including a die-attach surface; and
   a surface acoustic wave filter chip flip-chip mounted on the die-attach surface of the wiring board; wherein
   the surface acoustic wave filter chip includes a piezoelectric substrate and a ladder surface acoustic wave filter unit located on the piezoelectric substrate;
   the ladder surface acoustic wave filter unit includes an input pad, an output pad, a series arm connecting the input pad and the output pad, and a plurality of resonators including at least one first resonator connected to the input pad or the output pad;
   the die-attach surface of the wiring board is provided with an inductor connected to the first resonator;
   the inductor is arranged such that at least a portion thereof faces the first resonator but does not face any of the plurality of resonators other than the first resonator;
   the wiring board includes an input terminal connected to the input pad and an output terminal connected to the output pad;
   the plurality of resonators include a plurality of series arm resonators connected in series in the series arm and at least one parallel arm resonator connected between the series arm and a ground potential;
   the first resonator is one of the plurality of series arm resonators; and
   the inductor is connected in parallel with the first resonator.

6. The surface acoustic wave filter device described in claim 5, wherein the surface acoustic wave filter device is a branching filter.

* * * * *